US010080300B1

(12) United States Patent
Olesiewicz et al.

(10) Patent No.: US 10,080,300 B1
(45) Date of Patent: Sep. 18, 2018

(54) MECHANICAL LATCH MODULE

(71) Applicant: EMC Corporation, Hopkinton, MA (US)

(72) Inventors: Timothy Olesiewicz, Dublin, CA (US); Christopher Frank, San Jose, CA (US)

(73) Assignee: EMC IP Holding Company LLC, Hopkinton, MA (US)

(*) Notice: Subject to any disclaimer, the term of this patent is extended or adjusted under 35 U.S.C. 154(b) by 303 days.

(21) Appl. No.: 14/983,252

(22) Filed: Dec. 29, 2015

(51) Int. Cl.
 E05C 3/06 (2006.01)
 H05K 5/02 (2006.01)
 H05K 5/00 (2006.01)

(52) U.S. Cl.
 CPC ......... H05K 5/0221 (2013.01); H05K 5/0004 (2013.01)

(58) Field of Classification Search
 CPC ...... G06F 1/187; G06F 1/1679; G06F 1/1658; E05C 19/022; H05K 5/0295; H05K 7/1405; H05K 7/1409; H05K 5/0208; H05K 5/0221; Y10S 292/04; H01R 13/4538; Y10T 70/5009; Y10T 292/432; Y10T 403/60
 USPC ....................................................... 292/200
 See application file for complete search history.

(56) References Cited

U.S. PATENT DOCUMENTS

| D257,345 S | 10/1980 | Levy |
| D260,881 S | 9/1981 | McKinsey et al. |
| 4,648,066 A | 3/1987 | Pitt |
| 4,657,291 A * | 4/1987 | Kurosaki ............ E05C 19/022 292/6 |
| 5,045,960 A | 9/1991 | Eding |
| 5,065,321 A | 11/1991 | Bezos et al. |
| D332,256 S | 1/1993 | Lewis |

(Continued)

FOREIGN PATENT DOCUMENTS

| DE | 102006016743 A1 | 10/2007 |
| EP | 1420623 A1 | 5/2004 |

(Continued)

OTHER PUBLICATIONS

International Search Report for corresponding International Application PCT/US2014/065369, dated Mar. 11, 2015 (6 pages).

(Continued)

Primary Examiner — Mark A Williams
(74) Attorney, Agent, or Firm — Chamberlain, Hrdlicka, White, Williams & Aughtry

(57) ABSTRACT

A latch module that includes a button carriage that is slidably coupled to a latch module chassis, thereby enabling the button carriage to move between an extended and a depressed position. The button carriage, when a user-operable button of the button carriage is depressed a first time, moves from the extended position to the depressed position. An inverter arm that is pivotally coupled to the latch module chassis and that is mechanically linked to the button carriage pivots when the button carriage, moves from the extended position to the depressed position, as the button is depressed. A latch arm that is mechanically linked to the inverter arm slides from a non-blocking position into a blocking position when the inverter arm pivots. In the blocking position, the latch arm extends beyond a retaining pin of a chassis; and in the non-blocking position, the latch arm clears the retaining pin.

19 Claims, 15 Drawing Sheets

(56) References Cited

U.S. PATENT DOCUMENTS

| | | | |
|---|---|---|---|
| 5,214,550 A | 5/1993 | Chan | |
| 5,253,129 A | 10/1993 | Blackborow et al. | |
| 5,297,067 A | 3/1994 | Blackborow et al. | |
| 5,316,488 A | 5/1994 | Gardner et al. | |
| 5,387,115 A | 2/1995 | Kozel et al. | |
| 5,691,860 A | 11/1997 | Hoppe | |
| 5,701,894 A | 12/1997 | Cherry et al. | |
| 5,764,480 A | 6/1998 | Crump et al. | |
| 5,825,616 A | 10/1998 | Howell et al. | |
| D408,379 S | 4/1999 | McGraw et al. | |
| 6,083,018 A | 7/2000 | Hara et al. | |
| 6,137,759 A | 10/2000 | Ogiro et al. | |
| 6,174,180 B1 | 1/2001 | Chen | |
| 6,185,103 B1 | 2/2001 | Yamada | |
| 6,222,727 B1 | 4/2001 | Wu | |
| 6,257,029 B1 * | 7/2001 | Liao | E05B 3/0005 |
| | | | 242/551 |
| 6,359,778 B1 | 3/2002 | Wu | |
| 6,373,696 B1 | 4/2002 | Bolognia et al. | |
| 6,388,884 B1 | 5/2002 | Greco et al. | |
| 6,396,704 B1 | 5/2002 | White | |
| 6,683,785 B1 | 1/2004 | Chen | |
| 6,873,356 B1 * | 3/2005 | Kanbe | G03B 29/00 |
| | | | 348/207.1 |
| 6,987,927 B1 | 1/2006 | Battaglia et al. | |
| 7,023,704 B1 | 4/2006 | Zarnowitz et al. | |
| 7,088,579 B1 | 8/2006 | Konshak | |
| 7,251,145 B1 | 7/2007 | Reznikov | |
| 7,301,776 B1 | 11/2007 | Wang et al. | |
| 7,318,532 B1 * | 1/2008 | Lee | H05K 7/1405 |
| | | | 211/26 |
| 7,362,566 B1 | 4/2008 | Sivertsen | |
| 7,396,244 B1 | 7/2008 | Bama et al. | |
| 7,885,064 B2 * | 2/2011 | Chen | E05B 63/18 |
| | | | 292/242 |
| 7,944,691 B1 | 5/2011 | Pounds | |
| D698,792 S | 2/2014 | Lin et al. | |
| 2002/0018423 A1 | 2/2002 | Gable | |
| 2002/0030927 A1 | 3/2002 | Kimura et al. | |
| 2002/0033890 A1 | 3/2002 | Nicklos et al. | |
| 2002/0114254 A1 | 8/2002 | Ohgaki | |
| 2002/0122295 A1 | 9/2002 | Laing | |
| 2002/0169912 A1 | 11/2002 | Mills et al. | |
| 2002/0182896 A1 | 12/2002 | Welsh et al. | |
| 2003/0041203 A1 | 2/2003 | Jones et al. | |
| 2003/0136849 A1 | 7/2003 | Adelmann | |
| 2003/0161199 A1 | 8/2003 | Estakhri | |
| 2004/0057702 A1 | 3/2004 | Battaglia et al. | |
| 2004/0095731 A1 * | 5/2004 | Takada | G11B 33/121 |
| | | | 361/725 |
| 2004/0213141 A1 | 10/2004 | Lin | |
| 2004/0228184 A1 | 11/2004 | Mathiowetz | |
| 2004/0233629 A1 | 11/2004 | Wang et al. | |
| 2004/0242041 A1 | 12/2004 | Ngo | |
| 2005/0018397 A1 | 1/2005 | Kay et al. | |
| 2006/0030080 A1 | 2/2006 | Hsueh et al. | |
| 2006/0061955 A1 | 3/2006 | Imblum | |
| 2006/0072239 A1 | 4/2006 | Iftikar | |
| 2006/0146441 A1 | 7/2006 | Chih | |
| 2007/0070669 A1 | 3/2007 | Tsem | |
| 2007/0091556 A1 * | 4/2007 | Wu | G06F 1/1616 |
| | | | 361/679.57 |
| 2007/0217171 A1 | 9/2007 | Le | |
| 2007/0274032 A1 | 11/2007 | Ni et al. | |
| 2008/0002348 A1 | 1/2008 | Kim et al. | |
| 2008/0112125 A1 | 5/2008 | Martin et al. | |
| 2008/0218957 A1 | 9/2008 | Kim et al. | |
| 2008/0266779 A1 | 10/2008 | Thomas et al. | |
| 2008/0298009 A1 | 12/2008 | Weng et al. | |
| 2008/0298014 A1 | 12/2008 | Franco | |
| 2009/0034349 A1 | 2/2009 | Miura | |
| 2009/0086456 A1 | 4/2009 | Milo et al. | |
| 2009/0100217 A1 | 4/2009 | Battaglia et al. | |
| 2009/0147462 A1 | 6/2009 | Zhu et al. | |
| 2009/0172279 A1 | 7/2009 | Yuan et al. | |
| 2009/0185355 A1 | 7/2009 | Zhu et al. | |
| 2009/0198927 A1 | 8/2009 | Bondurant et al. | |
| 2009/0210636 A1 | 8/2009 | Karamcheti et al. | |
| 2009/0279243 A1 | 11/2009 | Amidi et al. | |
| 2010/0142243 A1 | 6/2010 | Baxter | |
| 2010/0323757 A1 | 12/2010 | Seflic et al. | |
| 2010/0332711 A1 | 12/2010 | Li et al. | |
| 2011/0107565 A1 * | 5/2011 | Shen | A44B 11/266 |
| | | | 24/633 |
| 2011/0153903 A1 | 6/2011 | Hinkle et al. | |
| 2011/0222234 A1 | 9/2011 | Davis et al. | |
| 2011/0261521 A1 | 10/2011 | Lo | |
| 2011/0292588 A1 | 12/2011 | Seeley | |
| 2012/0097623 A1 * | 4/2012 | Zhang | G06F 1/187 |
| | | | 211/26 |
| 2012/0233402 A1 | 9/2012 | Laaksonen et al. | |
| 2012/0278534 A1 | 11/2012 | Sun et al. | |
| 2013/0016464 A1 * | 1/2013 | Kim | H04M 1/0262 |
| | | | 361/679.01 |
| 2013/0054862 A1 | 2/2013 | Tsai | |
| 2013/0107424 A1 | 5/2013 | Thomas et al. | |
| 2013/0107443 A1 | 5/2013 | Kim et al. | |
| 2013/0148287 A1 | 6/2013 | Chang | |
| 2013/0163175 A1 | 6/2013 | Kim et al. | |
| 2013/0176676 A1 | 7/2013 | Keffeler et al. | |
| 2013/0176677 A1 | 7/2013 | Rust et al. | |
| 2013/0342989 A1 | 12/2013 | Singleton | |
| 2014/0078660 A1 | 3/2014 | Dondzik et al. | |
| 2014/0087787 A1 | 3/2014 | Rivera-Sanchez | |
| 2015/0131227 A1 * | 5/2015 | Howell | H05K 7/1405 |
| | | | 361/679.58 |

FOREIGN PATENT DOCUMENTS

| | | | |
|---|---|---|---|
| EP | 2275913 A1 | 1/2011 | |
| JP | 06-309860 A | 4/1994 | |
| WO | 03063560 A2 | 7/2003 | |
| WO | 2005029936 A1 | 3/2005 | |
| WO | 2007056669 A2 | 5/2007 | |
| WO | 2008103359 A1 | 8/2008 | |
| WO | 2009015285 A1 | 1/2009 | |
| WO | 2013029264 A1 | 3/2013 | |

OTHER PUBLICATIONS

Written Opinion of the International Searching Authority for corresponding International Application No. PCT/US2014/065369, dated Mar. 11, 2015 (6 pages).

Press Release, "3M Introduces New CompactFlash brand Type II Card Ejectors for Long Guide CFII Headers," 3M News, www.3M.com, Jul. 6, 2006 (2 pages).

Doug Hoy, "Delphi Connection Systems Adds to Growing Portfolio with Introduction of PCI Express(TM), DDR2-DIMM Series; Computing Products' Availability Announced During Appearance at IDF.," PR Newswire, http://www.thefreelibrary.com/Delphi+Connection+Systems...s+to+Growing+Portfolio+with+Intruction...-a0121678034, Sep. 7, 2004 (4 pages).

StarTech.com, "Removable 2.5" SATA HDD Enclosure/Backup System/Mobile Rack for 3.5/5.25" Bay", Product ID: SAT2510U3REM, http://www.startech.com/HDD/Mobile-Racks/Removable-Hard-Drive-Enclosure-Backup-System-SAT2510U3REM, date accessed Apr. 16, 2014 (3 pages).

PC Support Services Ltd., "The Saturn Mobile Rack", http://www.pcssl.co.nz/documents/prodinfo/addonics/Saturn%20and%20Cipher/MobileRack.htm, dated accessed Apr. 16, 2014 (5 pages).

ICY DOCK, "EZ-Fit MB990SP-B Tool-less Dual 2.5" SSD/HDD Mounting Kit / Bracket", http://www.icydock.com/goods.php?id=79, date accessed Apr. 16, 2014 (3 pages).

"Removable Memory Cartridge Houses 2.5-Inch SATA Drives", http://www.cotsjournalonline.com/articles/view/103844, date accessed Apr. 16, 2014 (1 page).

Tapeonline.com, "Imation RDX 500GB Removable Cartridge", http://www.tapeonline.com/products/imation-rdx-rdx-500gb-removable-cartridge, date accessed Apr. 16, 2014 (2 pages).

(56) References Cited

OTHER PUBLICATIONS

"Quantum RDX", Quantum Datasheet, http://www.quantum.com/products/removablediskdrives/rdx/index.aspx, date accessed Apr. 16, 2014 (2 pages).
Plastiras, Elias, "HP Z1 workstation (B4F79PA) review", PC World, http://www.pcworld.idg.com.au/review/hp/z1_workstation_b4t79pa_review/426935/, Jul. 6, 2012 (12 pages).
"CWC Debuts Low-Cost Rugged, Removable Solid State Memory Module Carrier", http://www.unmannedsystemstechnology.com/2013/12/cwc-debuts-low-cost-rugged-removable-solid-state-memory-module-carrier/, dated Dec. 19, 2013 (2 pages).
Curtiss-Wright, "Curtiss-Wright Acquired Parvus Corporation, Extends Curtiss-Wright's Capabilities in Rugged Small Form Factor Computing and Communications Subsystems", http://www.parvus.com/product/overview.aspx?prod=RuggedRemovableMassStorage, date accessed Apr. 15, 2014 (2 pages).
Curtiss-Wright, Press Release, "Curtiss-Wright Controls Introduces Rugged Cartridges for Standard High-Density SATA Solid State Drives", http://news.thomasnet.com/fullstory/Rugged-Cartridges-facilitate-removeable-SATA-SSD-deployment-20019299, dated Dec. 12, 2013 (7 pages).
Synchrotech, "PCMCIA ATA Flash PC Cards FMJ Industrial", http://www.synchrotech.com/products/ata-flash-pcmcia-memory-pc_cards_12-fmj-industrial.html, date accessed Apr. 15, 2014 (2 pages).
Molex, "CompactFlash™", http://www.molex.com/molex/products/family?channel=products&chanName=family&key=compactflash, date accessed Apr. 15, 2014 (5 pages).

\* cited by examiner

MECHANICAL LATCH MODULE

BACKGROUND

Modular systems may include a chassis to house insertable hardware modules. These insertable hardware modules may need to be mechanically secured to prevent loosening during operation and/or transportation. Mechanical latch modules may be used to secure the hardware modules inserted in the chassis.

DETAILED DESCRIPTION

Figure 1A:
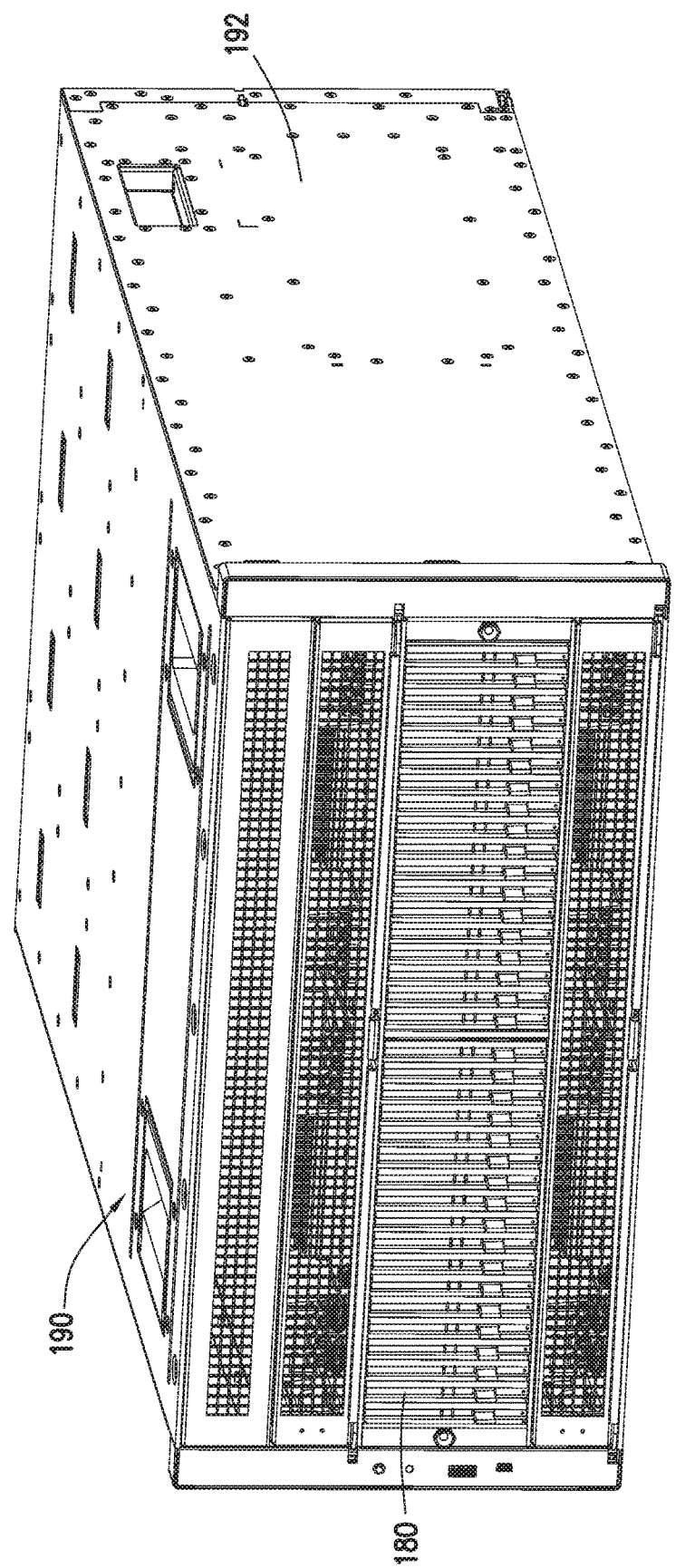
FIG. 1A shows a perspective view of a storage system in accordance with one or more embodiments of the technology.

Specific embodiments of the technology will now be described in detail with reference to the accompanying figures. Like elements in the various figures are denoted by like reference numerals for consistency.

In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1A-5B, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

In general, embodiments of the technology are directed to methods and systems for mechanically securing hardware modules that are inserted into a chassis. More specifically, one or more embodiments disclosed herein may be directed to mechanical latch modules. A latch module may be used, for example, to secure a solid state storage module in a storage system chassis. Those skilled in the art will recognize that the latch module is not limited to this exemplary application. Rather, any type of hardware module may be secured using a latch module in accordance with one or more embodiments of the technology.

Although one or more of these embodiments may be preferred, the embodiments disclosed should not be interpreted, or otherwise used, as limiting the scope of the disclosure, including the claims. In addition, those skilled in the art will appreciate that the following technology has broad application, and the discussion of any embodiment is meant only to be exemplary of that embodiment, and not intended to suggest that the scope of the disclosure, including the claims, is limited to that embodiment.

Certain terms are used throughout the following description and claims to refer to particular features or components. As those skilled in the art will appreciate, different persons may refer to the same feature or component by different names. This document does not intend to distinguish between components or features that differ in name but not function. The figures are not necessarily to scale. Certain features and components herein may be shown exaggerated in scale or in somewhat schematic form and some details of conventional elements may not be shown in interest of clarity and conciseness.

Figure 1B:
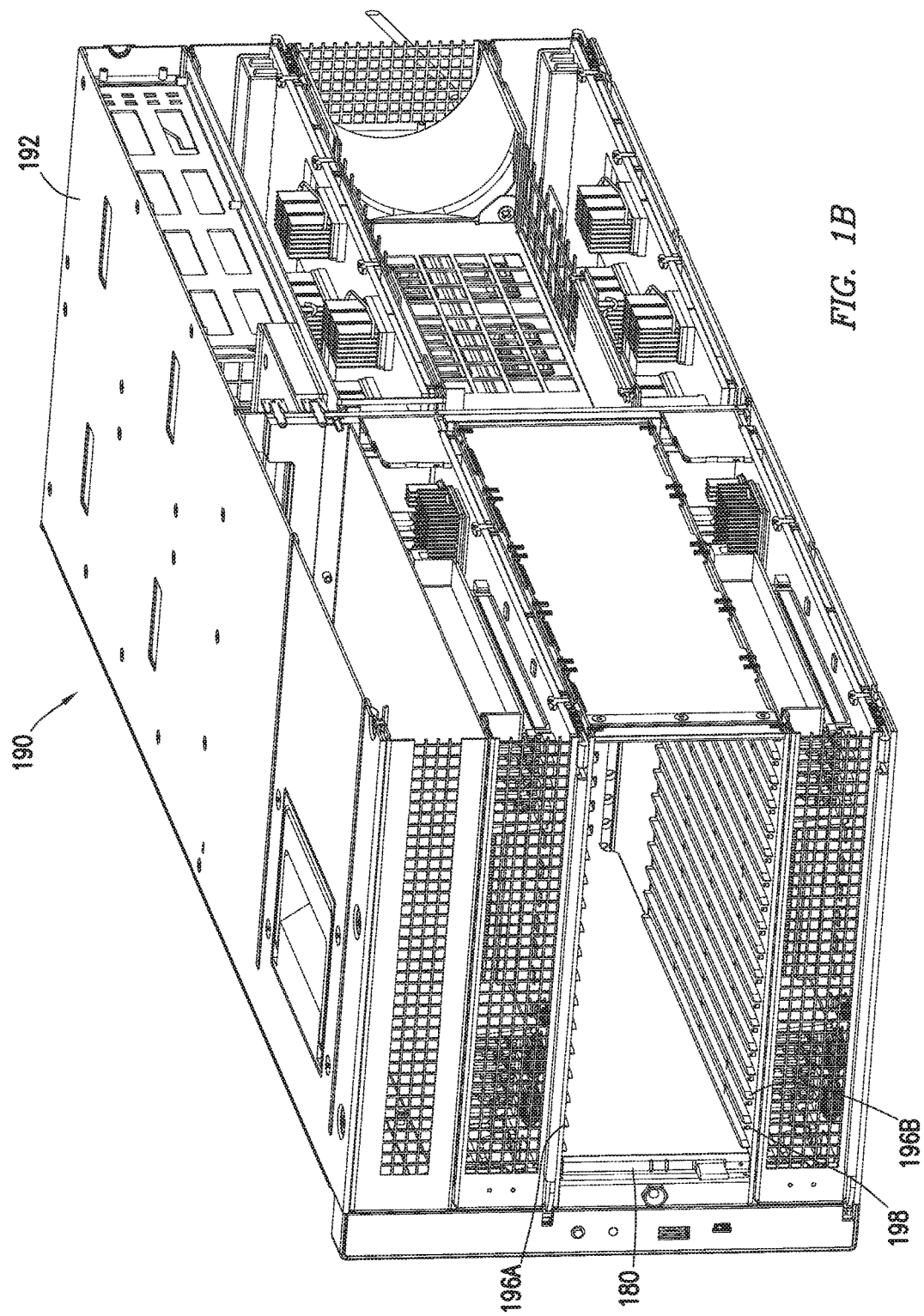
FIG. 1B shows a cross-sectional perspective view of a storage system in accordance with one or more embodiments of the technology.

Referring to FIGS. 1A and 1B, views of a storage system (190), in accordance with one or more embodiments of the technology, are shown. FIG. 1A shows a perspective view of the storage system (190) and FIG. 1B shows a cross-sectional perspective view of the partially assembled storage system (190).

In one or more embodiments of the technology, the storage system (190) may include a storage system chassis (192), in which one or more hardware modules may be disposed and mechanically secured within. For example, as shown in FIGS. 1A and 1B, one or more solid state storage modules (180) may be disposed within a front portion of the storage system chassis (192).

In one embodiment of the technology, the storage system chassis (192) is equipped with sets of rails (196A, 196B). A pair of rails (196A, 196B) may guide a solid state storage module (180), as it is slidably inserted into the storage system chassis (192). The solid state storage module (180) may be equipped with a set of slot cavities, further described below with reference to FIG. 2, that may accommodate the rails, as the solid state storage module is inserted into the storage system chassis.

In one or more embodiments of the technology, the storage system chassis (192) is further equipped with retaining pins (198). One retaining pin (198) may be provided for each solid state storage module (180) to be housed in the storage system chassis (192). A retaining pin may be a cylindrical pin that protrudes into one of the slot cavities of the solid state storage module (180). Elements of the mechanical latch module, further described below, may interface with the retaining pin (198) to mechanically secure the solid state storage module (180) inserted in the storage system chassis (192).

Figure 2:
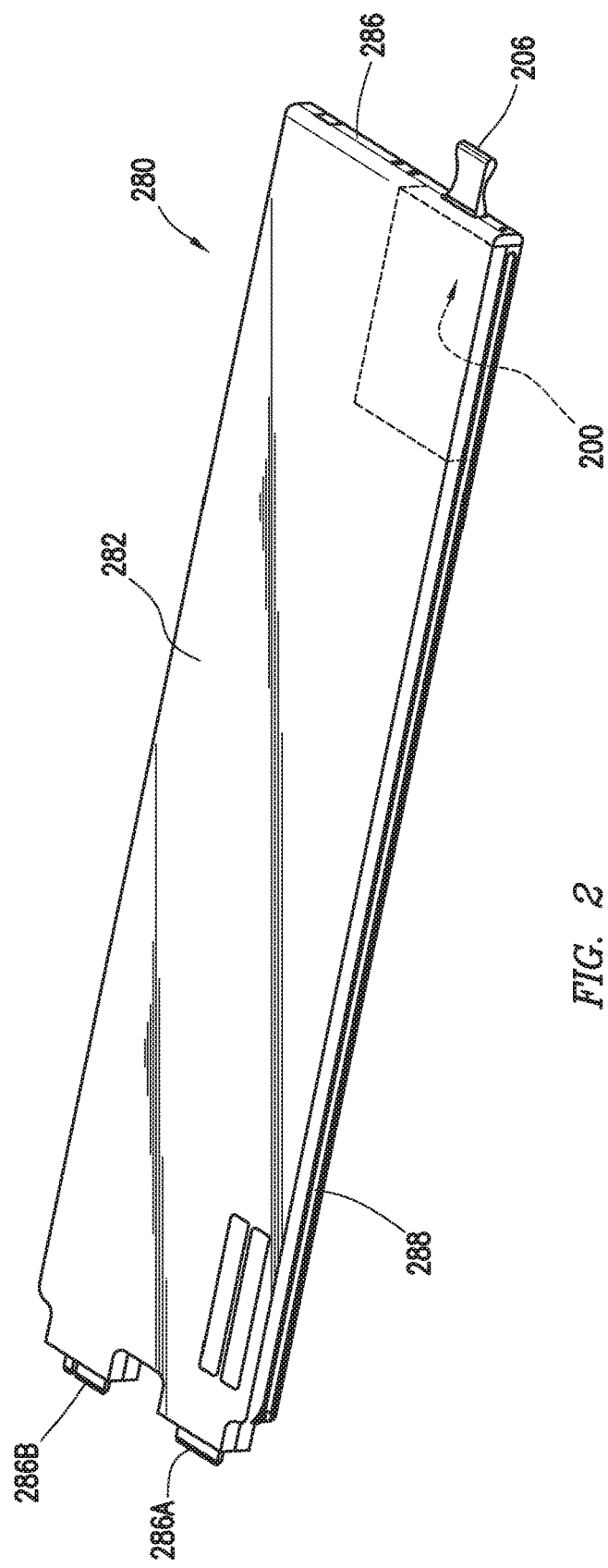
FIG. 2 shows a perspective view of a solid state storage module in accordance with one or more embodiments of the technology.

Referring to FIG. 2, a solid state storage module (280), in accordance with one or more embodiments of the technology, is shown.

The solid state storage module (280) may include a housing (282) and a button (206) that protrudes through a front faceplate (286) of the solid state storage module, and that enables a user to insert and remove the solid state storage module from the storage system chassis and further to mechanically lock and unlock the solid state storage module, inserted in the storage system chassis. In one or more embodiments of the technology, the housing (282) may form a cavity that may accommodate a mechanical latch module (200), whose approximate location is indicated by dashed lines. The button (206) may be operated by a user to engage/disengage the mechanical latch module.

The cavity within the housing (282), in accordance with an embodiment of the technology, may further accommodate a printed circuit board including solid state storage (e.g., NAND Flash memory, NOR Flash memory, Magnetic RAM Memory (MRAM), Spin Torque Magnetic RAM Memory (ST-MRAM), Phase Change Memory (PCM), memristive memory, or any other memory defined as a non-volatile Storage Class Memory (SCM)), and other integrated circuit components, capacitors, etc.), mounted thereon.

In one embodiments of the technology, the solid state storage module (280) also includes two 4× Peripheral Component Interconnect Express (PCIe) connectors (286A, 286B). The two 4×PCIe connectors may enable the solid state storage module to connect to other circuitry of the storage assembly system (190). The solid state storage module may be implemented with other types of connectors and/or with a different number of connectors, without departing from the technology.

In one or more embodiments of the technology, the solid state storage module (280) further includes one or more slot cavities (288). If the solid state storage module includes two slot cavities, the slot cavities may be located on opposite sides of the solid state storage module, forming tracks to accommodate the rails (196A, 196B) when slidably inserting the solid state storage module into the storage system chassis (192).

Figure 3A:
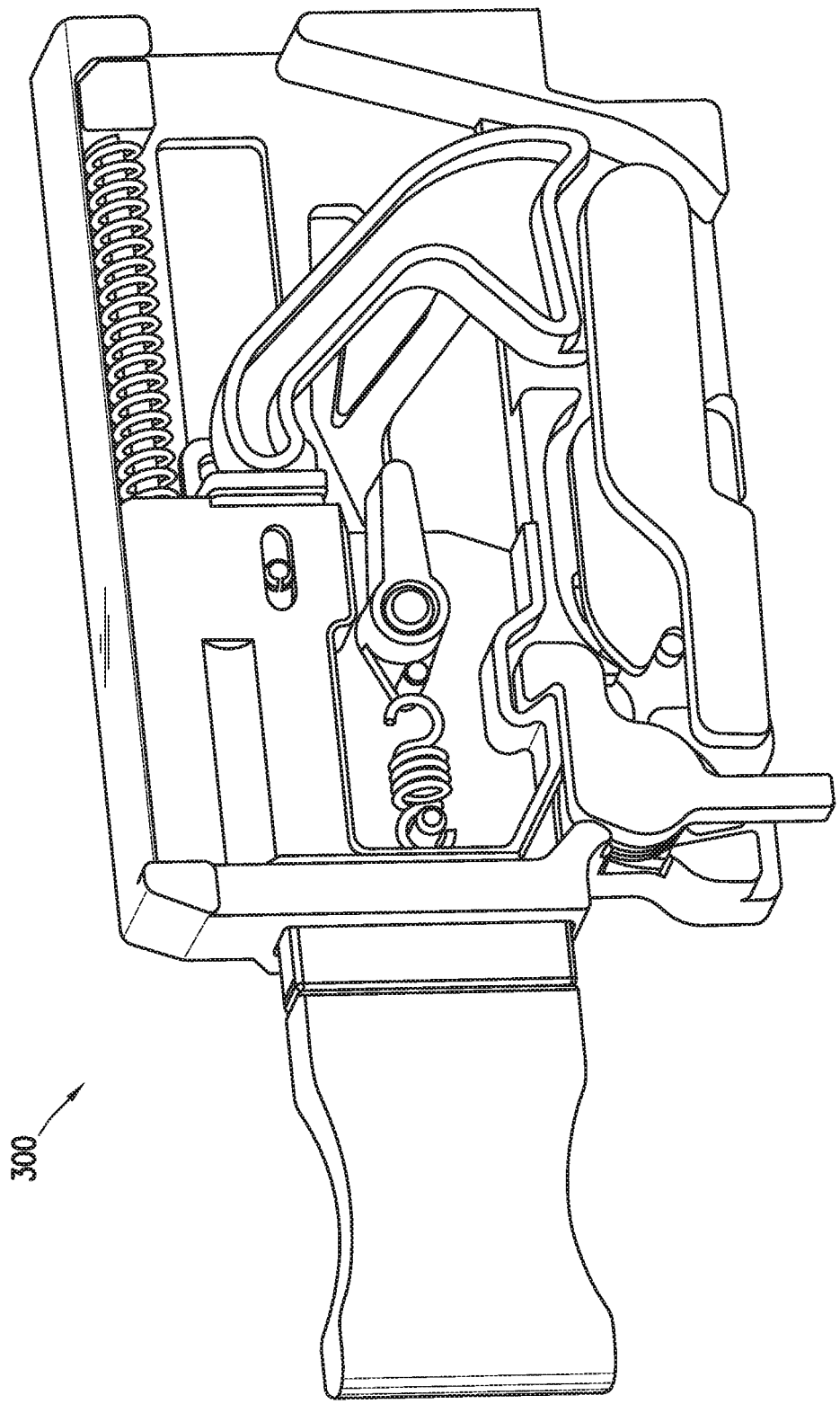
FIG. 3A shows a perspective view of a latch module in accordance with one or more embodiments of the technology.
Figure 3B:
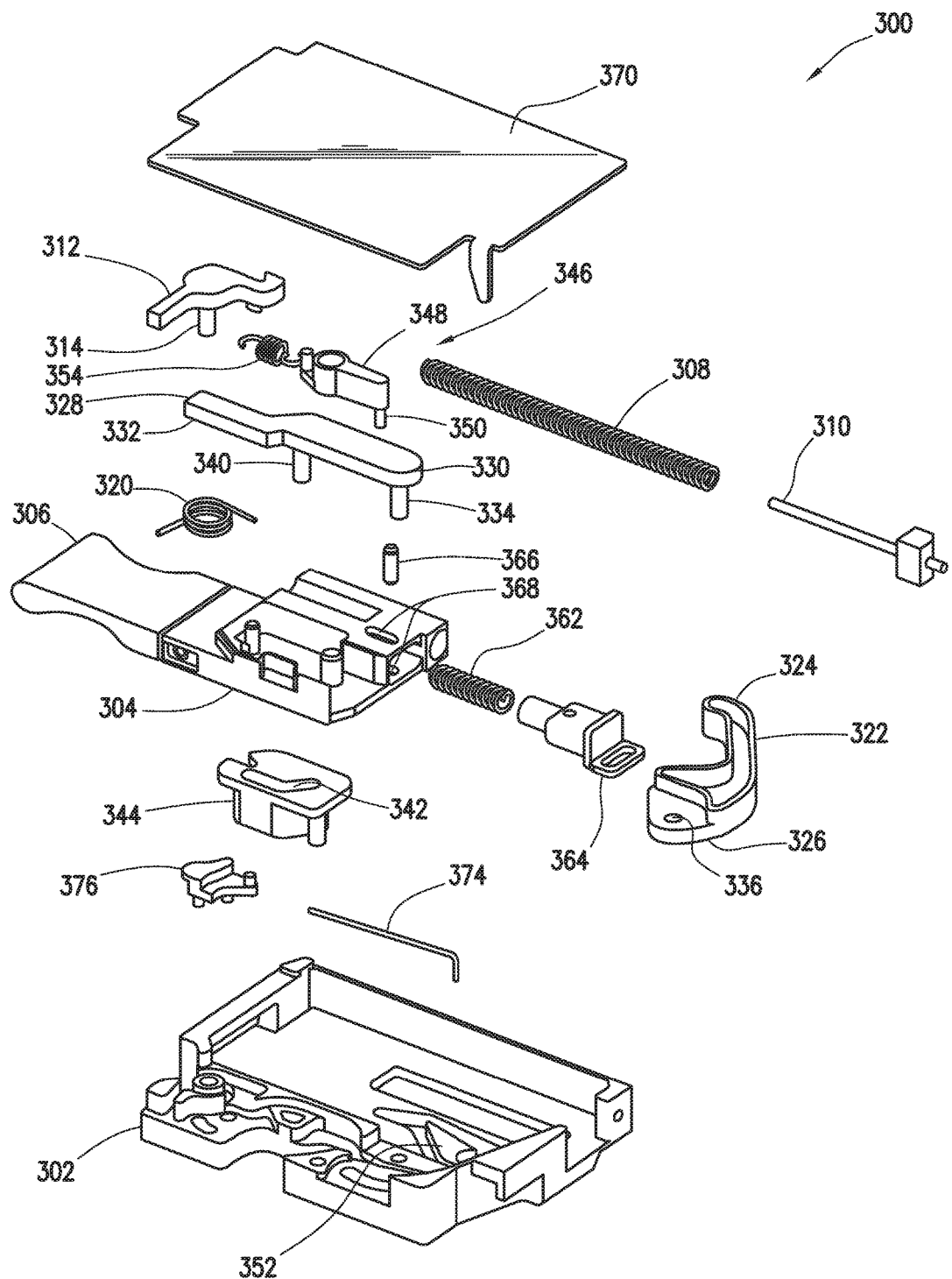
FIG. 3B shows an exploded view of a latch module in accordance with one or more embodiments of the technology.

Referring to FIGS. 3A and 3B, multiple views of a mechanical latch module (300), in accordance with one or more embodiments of the technology, are shown. FIG. 3A shows a perspective view of the mechanical latch module (300) and FIG. 3B shows an exploded view of the latch module (300) in accordance with one or more embodiments of the technology.

The latch module (300) may include a latch module chassis (302) and a number of additional latch module elements that are subsequently described with reference to FIGS. 4A-5B. The latch module chassis (302) may form a cavity that may house these latch module elements. In one or more embodiments of the technology, the latch module chassis (302) includes mechanical features to accommodate these latch module elements. For example, the latch module chassis may include a recess for linearly guiding a button carriage, the latch module chassis may include holes or pins to form pivot points for pivoting mechanical parts, etc., as further described below. The latch module (300) may further include a latch module cover (370) to encapsulate the latch module elements. The latch module chassis (302) may be part of a hardware module's housing (e.g. the solid state storage module's housing (282)), or it may be an additional element, that rigidly interfaces with the hardware module's housing, and that may be integrated into the hardware module's housing.

FIGS. 4A-4J show the mechanical latch module (300) in various states, as the latch module is engaged, thereby mechanically securing a hardware module (e.g., solid state memory module (280)), equipped with the latch module in a system chassis (392) (e.g., in storage system chassis (192)), and as the latch module is disengaged. In FIGS. 4A-4J, in accordance with an embodiment of the technology, the hardware module including the latch module (300) has been inserted into a system chassis (392), guided by tracks in the system chassis that engage with the slot cavities (288) of the hardware module. Although the latch module (300) is a component of the hardware module, for simplicity's sake, only the latch module (300), but not the hardware module is shown.

Figure 4A:
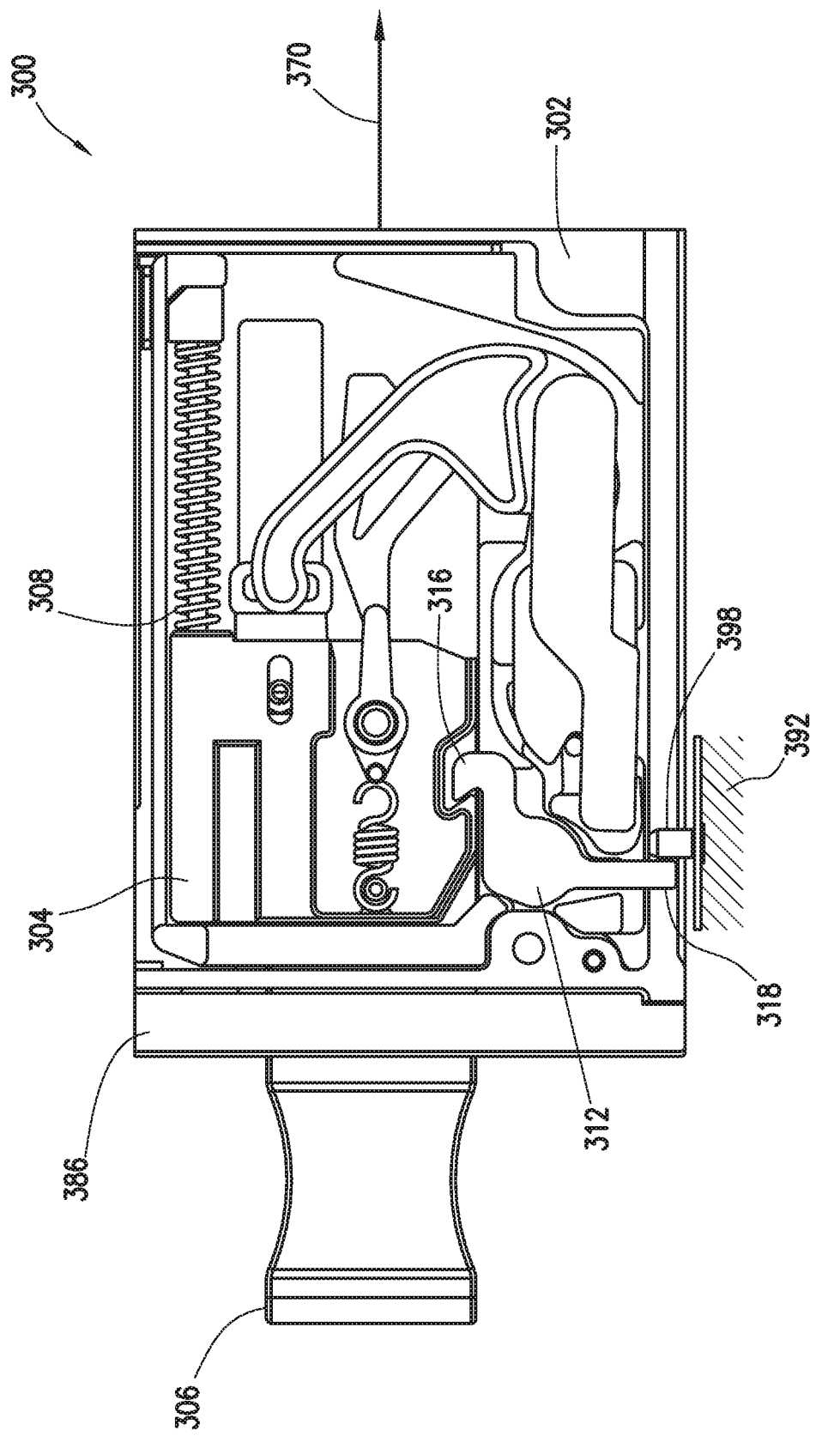
FIGS. 4A-5B show plan views of latch modules in accordance with one or more embodiments of the technology.

Turning to FIG. 4A, the mechanical latch module (300) is shown in a configuration in which the hardware module that includes the latch module has been partially inserted into the system chassis (392). In FIG. 4A, the insertion direction is from left to right, as indicated by the arrow. The hardware module has been inserted into the system chassis (392) far enough that the retaining pin (398) is about to interface with the latch module, as subsequently described.

In one or more embodiments of the technology, a button carriage (304) is slidably coupled to the latch module chassis (302). The button carriage (304) in accordance with an embodiment of the technology is configured to interface with various latch module elements that are described below. In the embodiment shown in FIG. 4A, the button carriage may move inward (to the right, in FIG. 4A), if the button (306), that is rigidly connected to the button carriage, and that protrudes from inside the cavity of the latch module chassis (302) through the faceplate (386) of the hardware module, is pressed (i.e., pushed inward) by a user, as illustrated in the subsequent figures. FIG. 4A shows the button carriage (304) and the button (306) in an extended (i.e., non-depressed position). In one embodiment of the technology, a button carriage biasing spring (308) pushes the button carriage (304) into the extended position. The button carriage biasing spring (308) may be a compression spring, supported on one side by a spring post (310) (see FIG. 3B). The button carriage biasing spring (308) may exert a force on the button carriage thereby pushing the button carriage into the extended position. The button (306), prominently protruding beyond the faceplate (386) of the hardware module, in accordance with an embodiment of the technology, serves as a visual indicator, for the latch module (300) being disengaged thereby informing the user that the hardware module (386) is not properly secured in the system chassis (392).

In one embodiment of the technology, the latch module (300) includes a lock arm (312). The lock arm (312) may be pivotably coupled to the latch module chassis (302), by a pivot axis (314) (see FIG. 3B). A first end (316) of the lock arm (312), in the configuration shown in FIG. 4A, may engage with the button carriage (304), thereby blocking inward movement of the button carriage. A user may therefore not be able to operate the latch by pressing the button (306). A second end (318) of the lock arm (312) may protrude into the slot cavity (288) (see FIG. 2), enabling the second end (318) of the lock arm (312) to interface with the retaining pin (398) of system chassis (392). Upon contact with the retaining pin (398) the second end (318) of the lock arm (312) may cause the lock arm to rotate in a clockwise direction, thereby disengaging the first end (316) of the lock arm (312) from the button carriage (304), thus allowing the button carriage to move, as described in the subsequent figures.

The lock arm (312) may be biased in a counterclockwise direction by a torsion spring (320), (see FIG. 3B). The torsion spring, in accordance with an embodiment of the technology, maintains the lock arm (312) in the position where the first end (316) of the lock arm (312) is engaged with the button carriage (304), thereby ensuring that inward movement of the button carriage remains blocked until a configuration of the latch module (300), as shown in FIG. 4B, is reached.

Figure 4B:
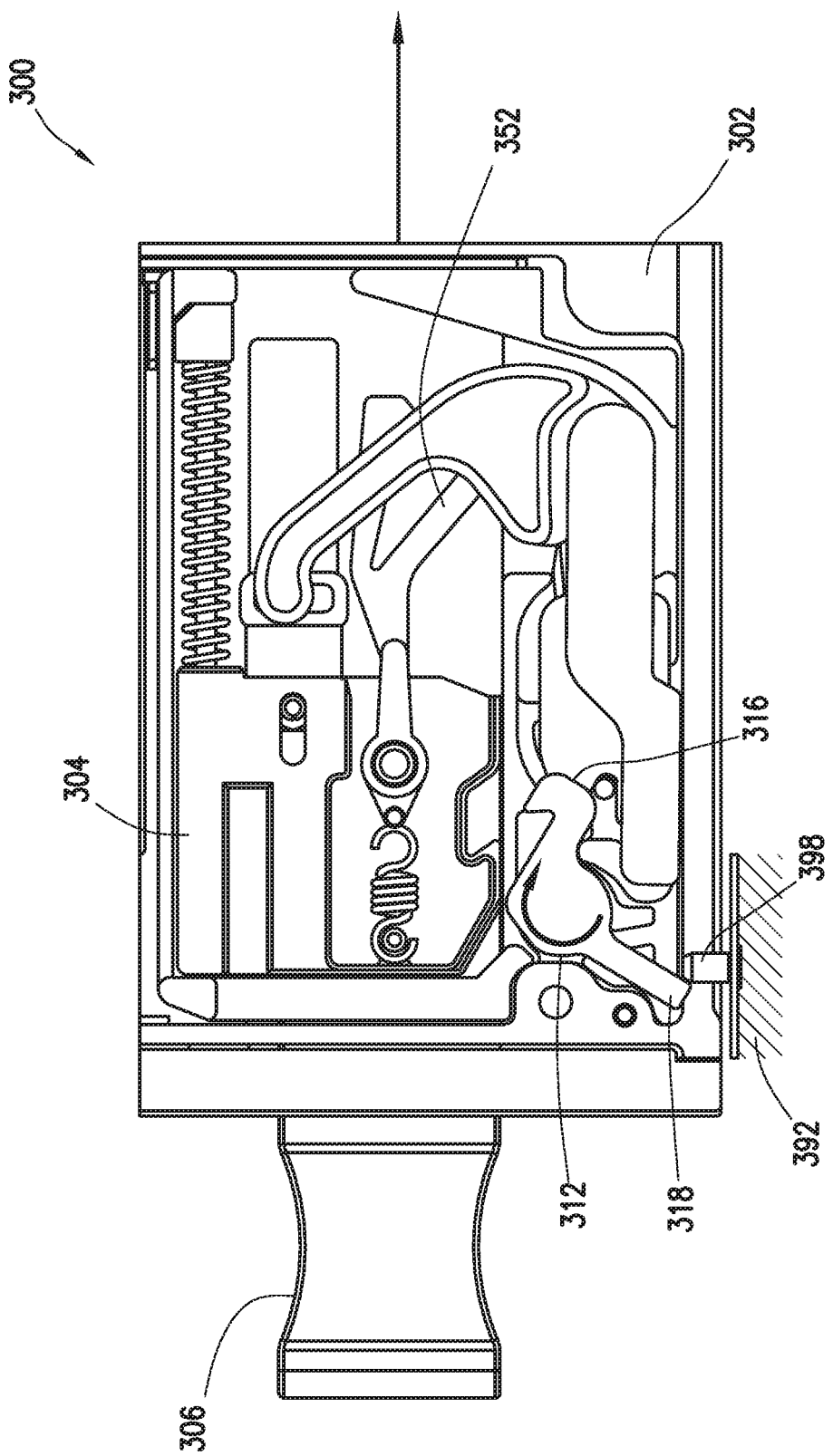

Turning to FIG. 4B, the mechanical latch module (300) is shown in a disengaged configuration in which the hardware module (not shown) equipped with the latch module has been fully inserted into the system chassis (392), but is not mechanically secured by the latch module (300). In the fully inserted position, electrical connectors (e.g., the PCIe connectors (286A, 286B, shown in FIG. 2) may properly interface with mating connectors of the system chassis (392).

Further, in accordance with an embodiment of the technology, in the fully inserted position, the retaining pin (398) of system chassis (392) interacts with the second end (318) of the lock arm (312), thereby pivoting the lock arm in a clockwise direction. As a result of the clockwise rotation of the lock arm (312), the first end (316) of the lock arm (312) may disengage from the button carriage (304), thus allowing button carriage (304) to move inward, when operated by a user pushing the button (306).

Figure 4C:
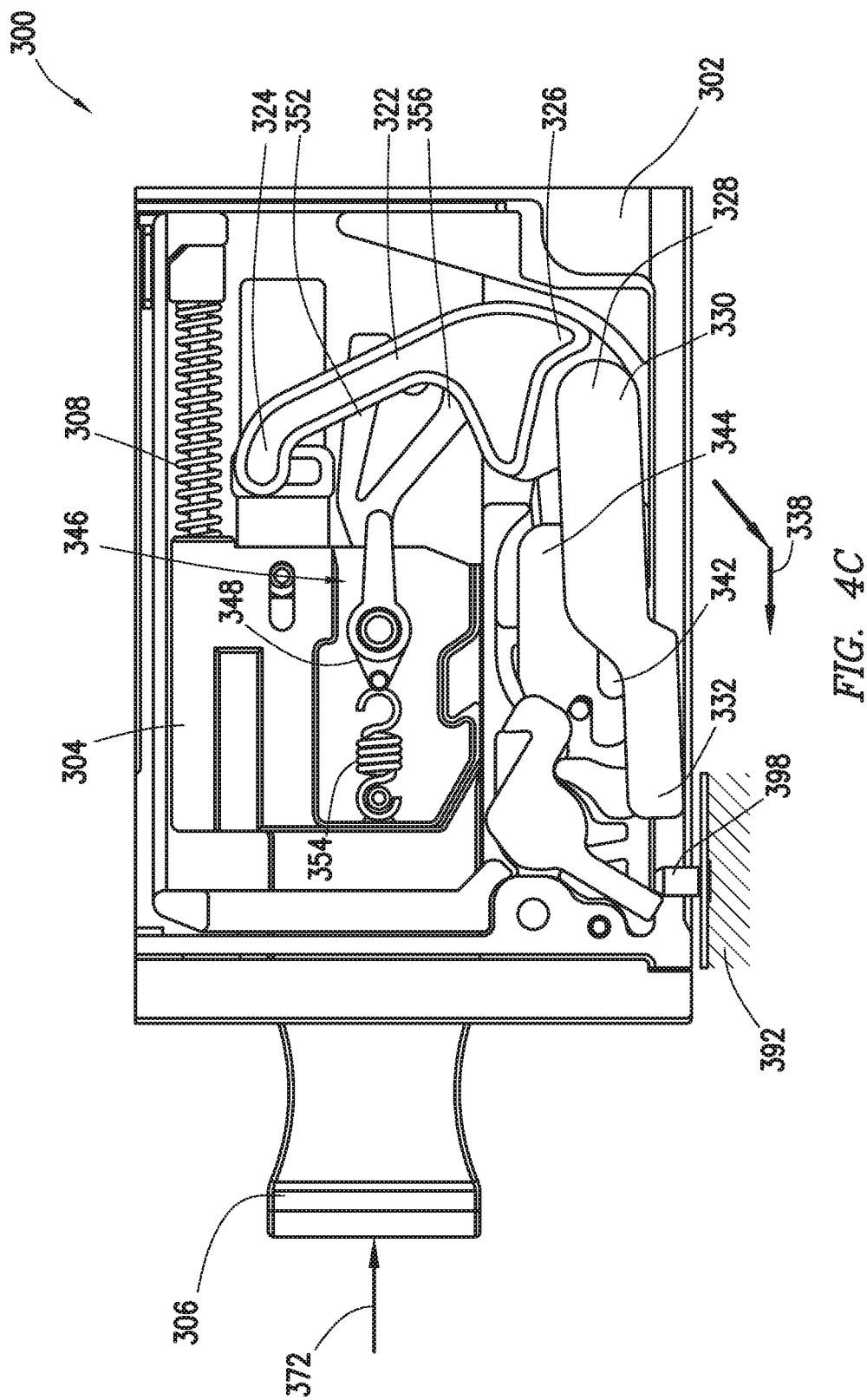

Turning to FIG. 4C, the mechanical latch module (300) is shown in a configuration in which a user begins to operate the latch module by applying a force (372) to the button, thereby depressing the button (306). The button (306) and button carriage (304) may begin to move inward, into the latch module chassis (i.e., to the right, in FIG. 4C), toward a depressed position of button (306) and button carriage (304), thereby actuating various latch module elements, as subsequently described.

In one embodiment of the technology, the inward moving button carriage (304) actuates an inverter arm (322). The inverter arm may be an elongated rigid structure with a first end (324), a second end (326), and a pivot point (not shown) located between the first and the second end. The inverter arm may be pivotally coupled to the latch module chassis (302) at the pivot point. As the button carriage (304) moves inward (to the right, in FIG. 4C), the first end (324) of the inverter arm (322), being mechanically linked to the button carriage, may be displaced to the right, thus causing the inverter arm to pivot in a clockwise direction, and causing the second end (326) of the inverter arm (322) to move to the left.

In one embodiment of the technology, the leftward moving second end (326) of the inverter arm (322) actuates a latch arm (328). The latch arm may be an elongated rigid structure with a first end (330) and a second end (332). The movement of the latch arm (328) may be constrained to a linear or partially linear trajectory, substantially in a left/right direction, as further described below. Further, in accordance with an embodiment of the technology, the first end (330) of the latch arm (328) is pivotally coupled to the second end (326) of the inverter arm (322), for example, using a pivot pin (334) protruding from the first end (330) of the latch arm (328), that interfaces with a pin hole (336) located at the second end (326) of the inverter arm (322).

As the second end (326) of the inverter arm (322) moves to the left, the latch arm (328) may be displaced on a trajectory, substantially to the left. In one embodiment of the technology, the latch arm trajectory (338) of the second end (332) of the latch arm (328) includes a leftward and a downward component. The leftward and downward components of the latch arm trajectory (338) may be configured to have the latch arm (328) in a retracted, non-blocking position, thereby clearing the retaining pin (398) when the latch module is disengaged (as shown in FIG. 4B), and to have the latch arm (328) extended into a blocking position to interface with the retaining pin (398), thereby mechanically locking the latch module (300) and the hardware module equipped with the latch module into the system chassis (392) (as shown in FIGS. 4E and 4F, where the latch module is shown in an engaged state). FIG. 4C shows an intermediate state, where the latch module is in the process of being engaged. Accordingly, the second end (332) of the latch arm (328) is shown in a position where it is lowered and has moved leftward toward the retaining pin (398), but where it is not yet interfacing with the retaining pin.

In one embodiment of the technology, the latch arm trajectory (338) is governed by a guide pin (340) of the latch arm (328) traveling in a track arm slot (342). The track arm slot may be located in a track arm (344) that is mechanically coupled to the latch module chassis (302), as further described below, with reference to FIGS. 5A and 5B.

Continuing with the discussion of FIG. 4C, in one embodiment of the technology, the latch module (300) further includes a locking mechanism (346). The locking mechanism in accordance with an embodiment of the technology, is configured to lock the button carriage (304) in the depressed position, once a user has fully depressed the button (306), as shown in FIGS. 4E and 4F, thereby permanently engaging the latch module (300), until an additional user operation disengages the latch module. The locking mechanism (346) may only release the button carriage after a user presses the button (306) a second time, allowing the button carriage (304) and the button (306) to return to the extended position, shown in FIG. 4B.

In FIG. 4C, the locking mechanism (346) is shown in an intermediate state, as the button carriage (304), with the button (306) being pressed by the user, is moving inward. The locking mechanism (346) may include a follower arm (348). The follower arm may be pivotally coupled to the button carriage (304) and may be equipped with a follower pin (350), configured to follow a follower arm track circuit (352) that may be implemented in the latch module chassis (302). The follower arm track circuit may be a grove in the latch module chassis. As the follower arm (348) tracks the follower arm track circuit (352), the follower arm (348) may pivot about the follower arm's pivot point. Various states of the follower arm (348) are shown in FIGS. 4A-4J. Generally speaking, the follower arm may move from a disengaged position (shown in FIG. 4B) to an engaged position (shown in FIGS. 4E and 4F), following an engaging segment (356) of the follower arm track circuit (352). FIG. 4C shows a state, in which the follower arm (348), with the button carriage (304) traveling from the extended position to the depressed position, is in an intermediate position on the engaging segment (356) of the follower arm track circuit (352).

In one embodiment of the technology, the follower arm (348) is self-centering. An extension spring (354) may generate a return force toward a centered state of the follower arm (348). In FIG. 4C, the follower arm is in the centered state.

Figure 4D:
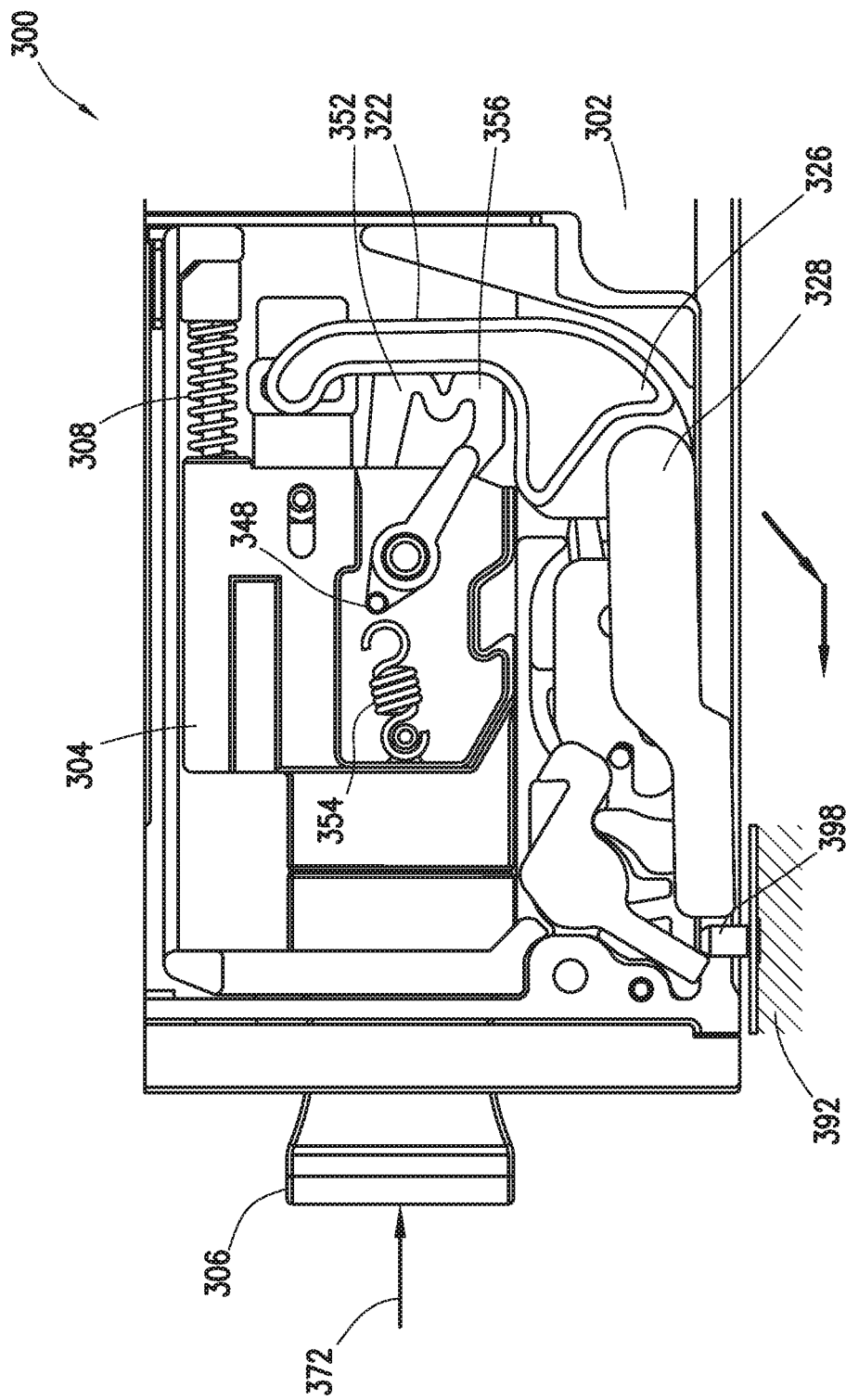
Figure 4E:
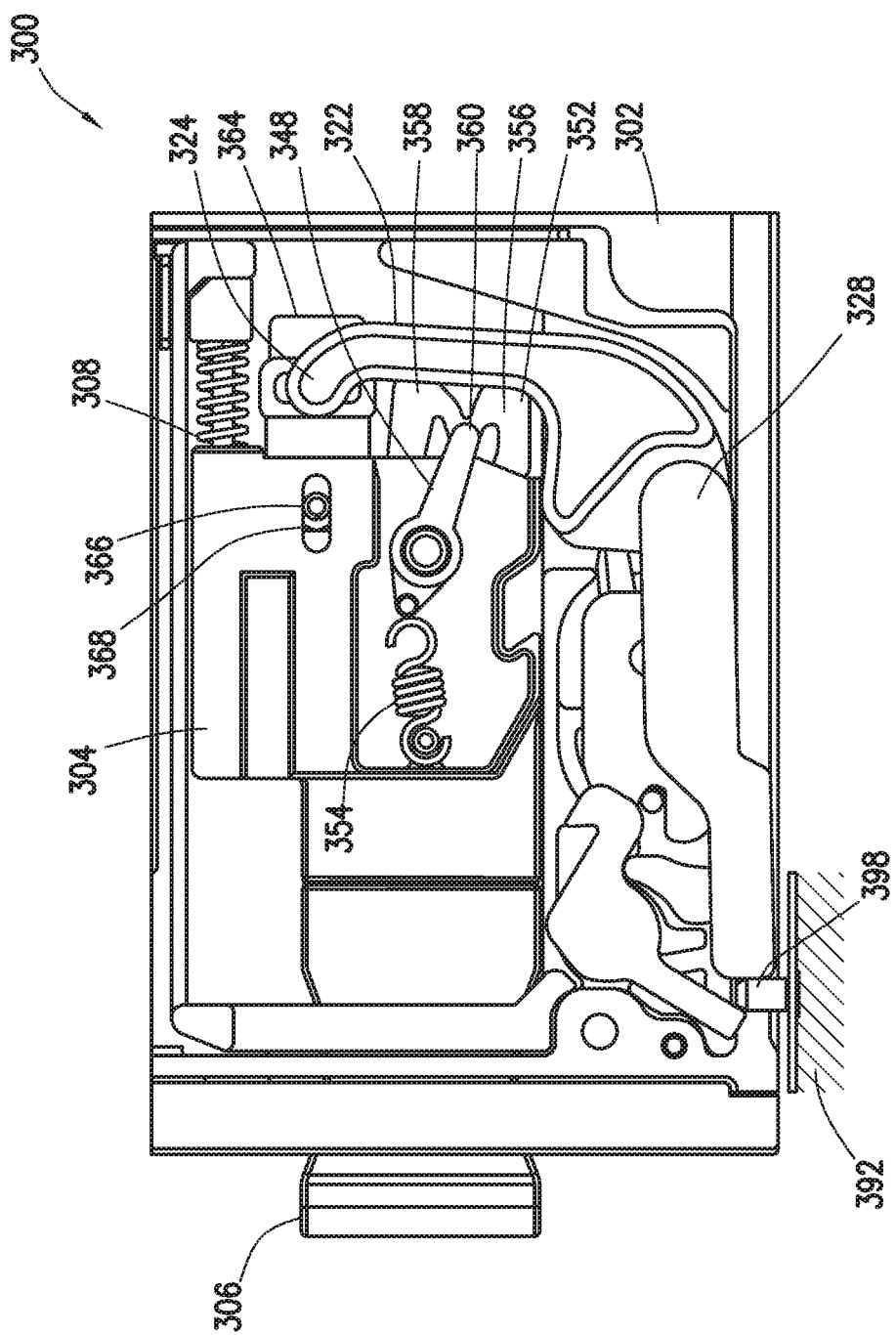
Figure 4F:
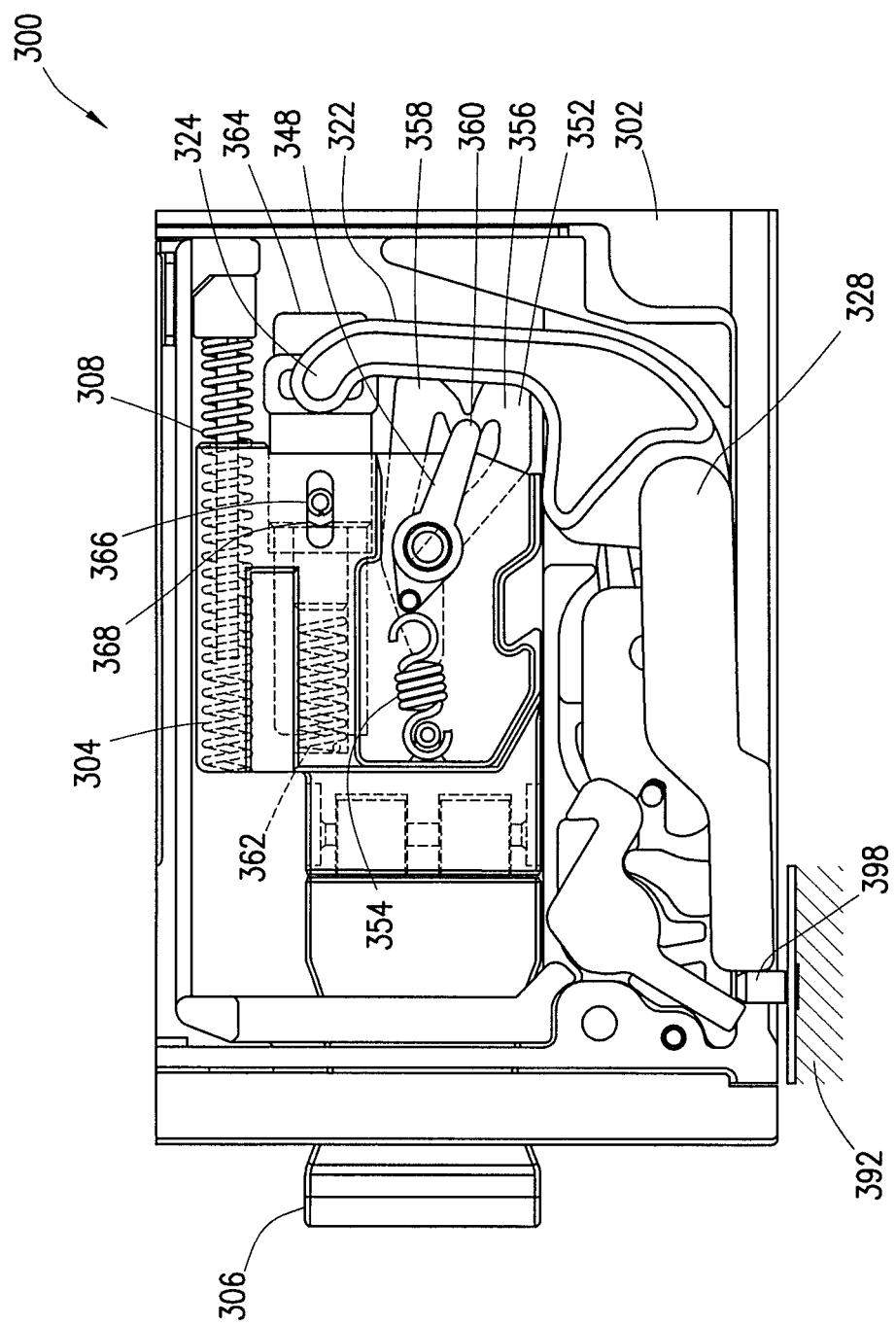

Turning to FIG. 4D, the mechanical latch module (300) is shown in a configuration in which the user has further depressed the button (306), causing the button carriage (304) to move toward the depressed position. The configuration of various latch module elements has therefore changed, as subsequently described.

The inverter arm (322) has further pivoted in a clockwise direction, thereby advancing the latch arm (328) toward the blocking position. The second end (332) of the latch arm (328) almost interfaces with the retaining pin (398) of the system chassis (392).

Further, the follower arm (348) has reached a position on the engaging segment (356) of the follower track (352), where the follower arm (348) has left the self-centered state, thereby extending the extension spring (354).

Turning to FIGS. 4E and 4F, the mechanical latch module (300) is shown in a configuration in which the latch module (300) is engaged. To reach the configuration shown in FIGS. 4E and 4F, the user may have fully depressed and then released the button (306), thereby reaching the engaged state of the latch module, in which the latch arm (328) may interface with the retaining pin (398) of the system chassis (392), thereby firmly locking the hardware module (not shown), equipped with the latch module (300) in place, within the system chassis (392). FIGS. 4E and 4F both show identical configurations of the latch module in an engaged state. However, in FIG. 4F, the button carriage is shown as partially transparent, thereby revealing additional mechanical details, further discussed below.

Prior to reaching the configuration shown in FIGS. 4E and 4F, the button carriage (304) may continue to move inward, into the latch module chassis (302). The follower arm (348), following the engaging segment (356) of the follower arm track circuit (352), may be increasingly deflected away from the centered state of the follower arm (348), thereby increasing the return force applied by the extension spring (354).

With progressing inward movement of the button carriage (304), the follower arm (348), may reach a region on the engaging segment (356) of the follower arm track circuit (352), where the follower arm (348), driven by the return force imposed by the extension spring (354), may partially return toward the centered state of the follower arm (348), once the user releases the button (306). As the user releases the button, the button carriage (304) and the button (306) may slightly move outward, driven by the compressed button carriage biasing spring (308). The outward movement, in accordance with an embodiment of the technology is limited by the follower pin (350) of the follower arm (348) reaching the follower arm engaged position (360) in the follower arm track circuit (352), where further outward movement of the button carriage (304) is blocked. The follower arm (348) may only leave this configuration, once the user presses the button (306) a second time, thereby moving the button carriage (304) and follower arm (352) sufficiently inward to enable the follower pin (350) to reach the disengaging segment (358) of the follower arm track circuit (352) toward the disengaged position of the follower arm (348), as described with reference to FIGS. 4G-4J.

Continuing with the discussion of FIGS. 4E and 4F, in one embodiment of the technology, the latch module (300) further includes a latch biasing spring (362). The latch biasing spring may be a compression spring, located between the button carriage (304) and the inverter arm (322). In one embodiment of the technology, the latch biasing spring (362) is housed in a cavity of the button carriage (304), and exerts a pushing force on a plunger (364) that caps the cavity. The plunger, in turn, interfaces with the inverter arm (322) at the first end (324) of the inverter arm, in accordance with an embodiment of the technology. The plunger may be secured by a plunger pin (366) that traverses the plunger (364), and that may travel in plunger guide slots (368) formed in the button carriage (304), in walls surrounding the plunger (364). The plunger may therefore have a limited range of motion defined by the plunger guide slots (368). The latch biasing spring (362) is dimensioned such that the latch biasing spring may exert a pushing force on the plunger, at any location of the plunger within the range of motion defined by the plunger guide slots. When the button (306) is depressed by the user, and the latch arm (328) establishes contact with the retaining pin (398) of the system chassis (392), further depression of the button (306) may result in compression of the latch biasing spring (362), thereby generating a reaction force upon the inverter arm (322), which the inverter arm transmits via the latch arm (328) to the interface of the latch arm (328) with the retaining pin (398) of the system chassis (392). In one embodiment of the technology, the latch biasing spring (362) compensates for the slight outward movement of the button carriage (304), when the users releases the button (306). The hardware module, equipped with the latch module (300) may therefore be properly secured, when the latch module (300) is engaged, held in the engaged position by the follower pin (350) of the follower arm (348), being caught in the follower arm engaged position (360) in the follower arm track circuit (352), where further outward movement of the button carriage (304) is blocked. Further, the reaction force, generated by the latch biasing spring (362) may ensure that the hardware module, equipped with the latch module (300) is properly secured in the system chassis (392) despite manufacturing tolerances. Any looseness at the interface between the latch arm (328) and the retaining pin (398), in accordance with an embodiment of the technology, is eliminated by an extension or compression of the latch biasing spring (362).

In one embodiment of the technology, the geometry of the inverter arm (322) is such that the force produced by the latch biasing spring (362) is amplified. The force transmitted to the latch arm (328) at the second end (326) of the inverter arm (324) may be, for example, amplified by a mechanical advantage of approximately 2.3.

Figure 4G:
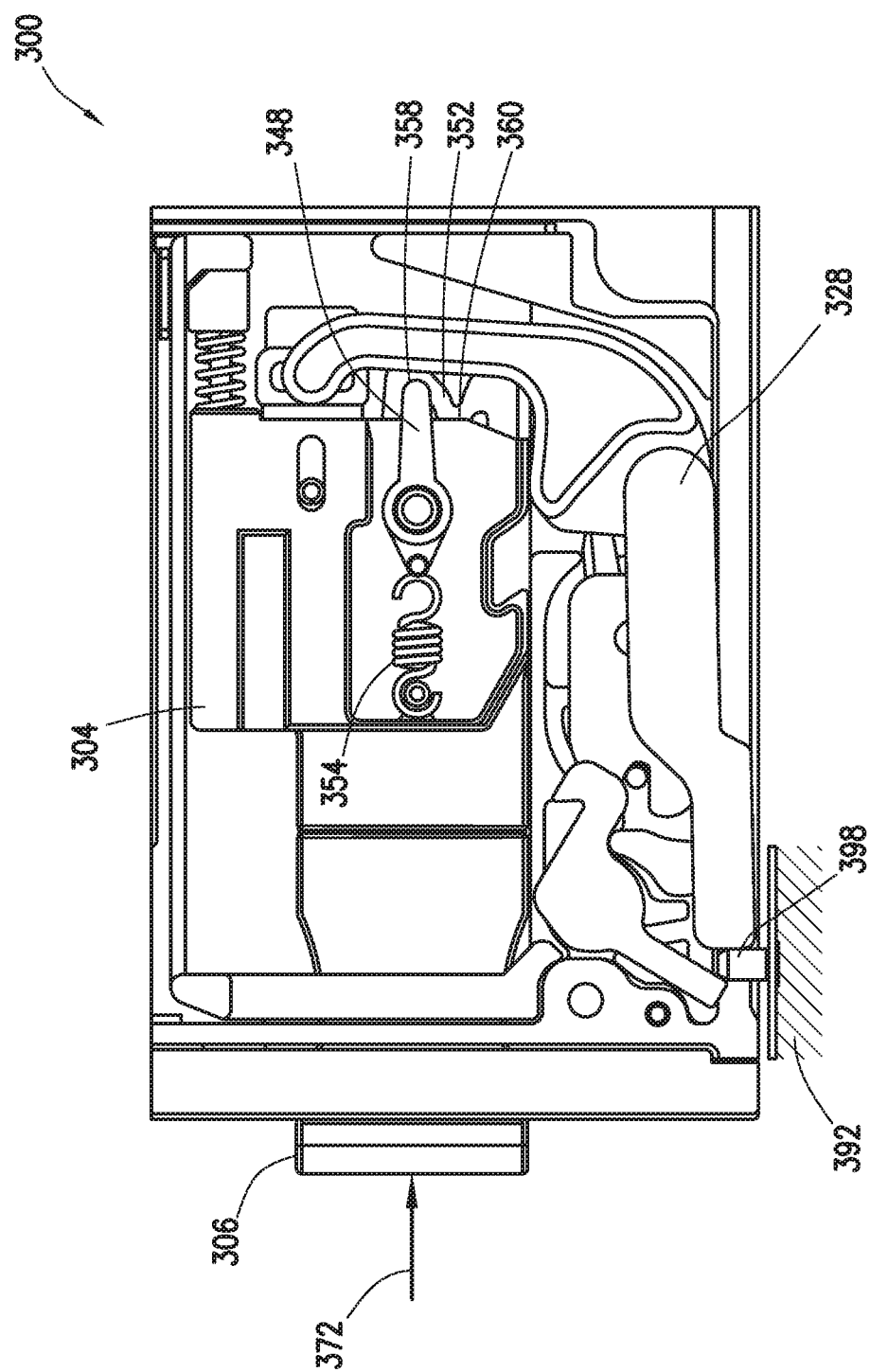

Turning to FIG. 4G, the mechanical latch module (300) is shown in a configuration in which the latch is in the engaged state, and the user begins to operate the button (306) a second time, by applying a force (372) to the button, thereby depressing the button (306). The button (306) and button carriage (304) may begin to move inward, into the latch module chassis (i.e., to the right, in FIG. 4G). As the button carriage (304) moves inward, the follower arm (348) may also move inward, along with the button carriage (304), thereby enabling the follower arm (348) to leave the follower arm engaged position (360). The follower arm (348) may pivot clockwise, driven by the return force generated by the extension spring (354) toward the centered state of the follower arm (348), while following the disengaging segment (358) of the follower arm track circuit (352). The latch arm (328) may remain pressed against the retaining pin (398) of the system chassis (392), as the latch biasing spring (362) gets further compressed by the plunger (364) moving into the cavity in the button carriage (304) that houses the latch biasing spring (362).

Figure 4H:
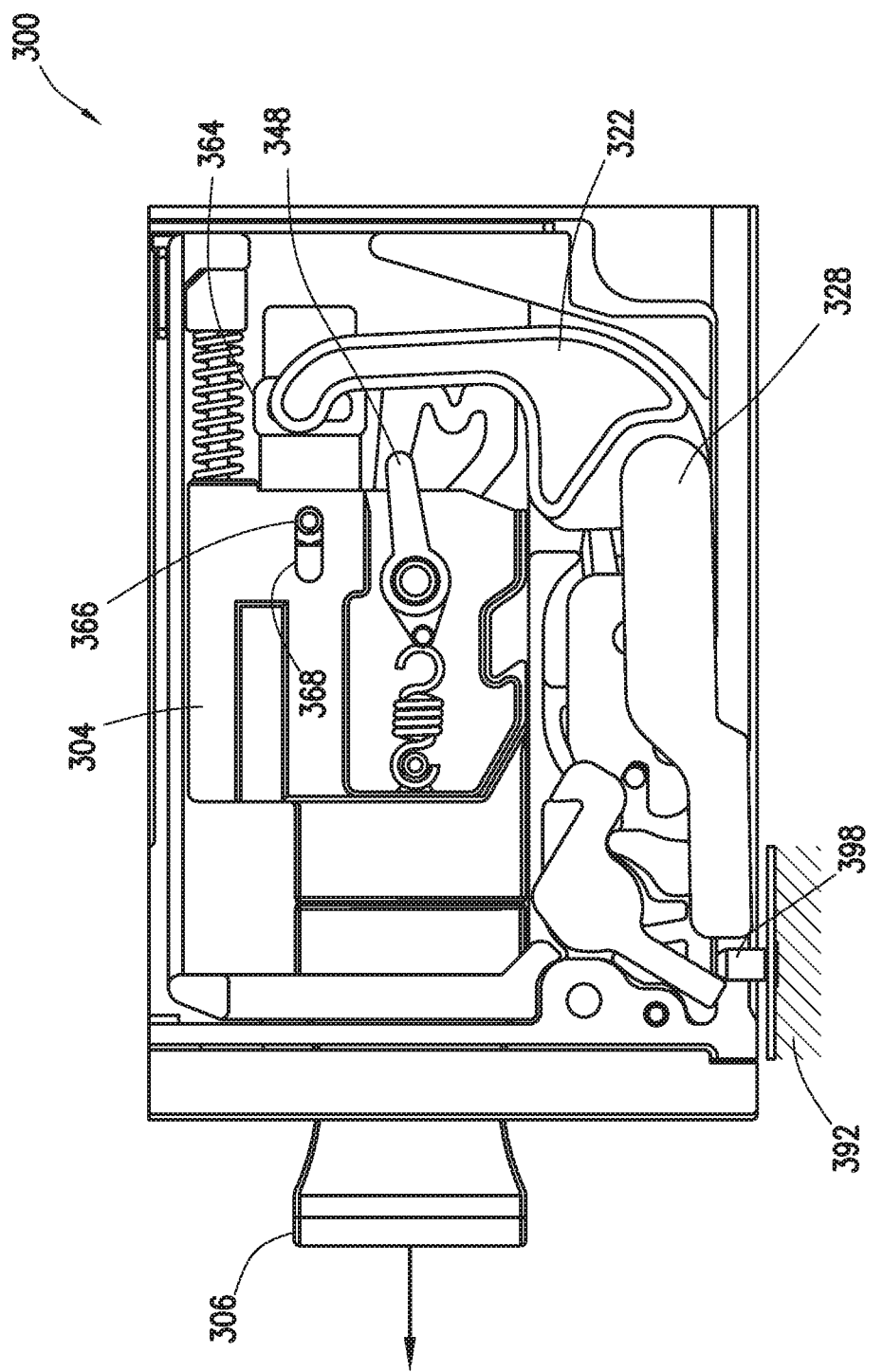

Turning to FIG. 4H, the mechanical latch module (300) is shown as it is transitioning from the engaged to the disengaged state. The button (306) and button carriage (304) may be moving outward, as indicated by the arrow, driven by the force of the extending button carriage biasing spring (308). As the button carriage (304) is moving outward, the latch biasing spring (362) may extend until the plunger (364) reaches an extended position, determined by the plunger pin (366) reaching the end of the plunger guide slots (368), as illustrated in FIG. 4H. Further, the follower arm (348) may continue traveling on the disengaging segment (358) of the follower arm track circuit (352) toward the disengaged position on the follower arm track circuit. As the button carriage (304) is moving outward, the inverter arm (322) may rotate counterclockwise and may retract the latch arm (328) upward and away from the retaining pin (398) of the system chassis (392) (to the right, in FIG. 4H).

Further, as the button carriage (304) is moving outward, the latch arm (328) may eventually be fully retracted, when the disengaged state of the latch module (300) (shown in FIG. 2B), is reached. In this state, the follower arm (348) may have reached the disengaged position on the follower arm track circuit (352), the latch arm (328) may no longer block the retaining pin (398), and the user may therefore remove the hardware module equipped with the latch module (300) from the system chassis (392), for example, by pulling on the button (306). When removing the hardware module from the system chassis, the state illustrated in FIG. 4A may be reached, in which the lock arm (312), no longer deflected by the retaining pin (398), driven by torsion spring (320) may return to its initial position, thereby engaging with the button carriage (304), thus preventing a user from operating the latch module by pressing the button (306).

Figure 5A:
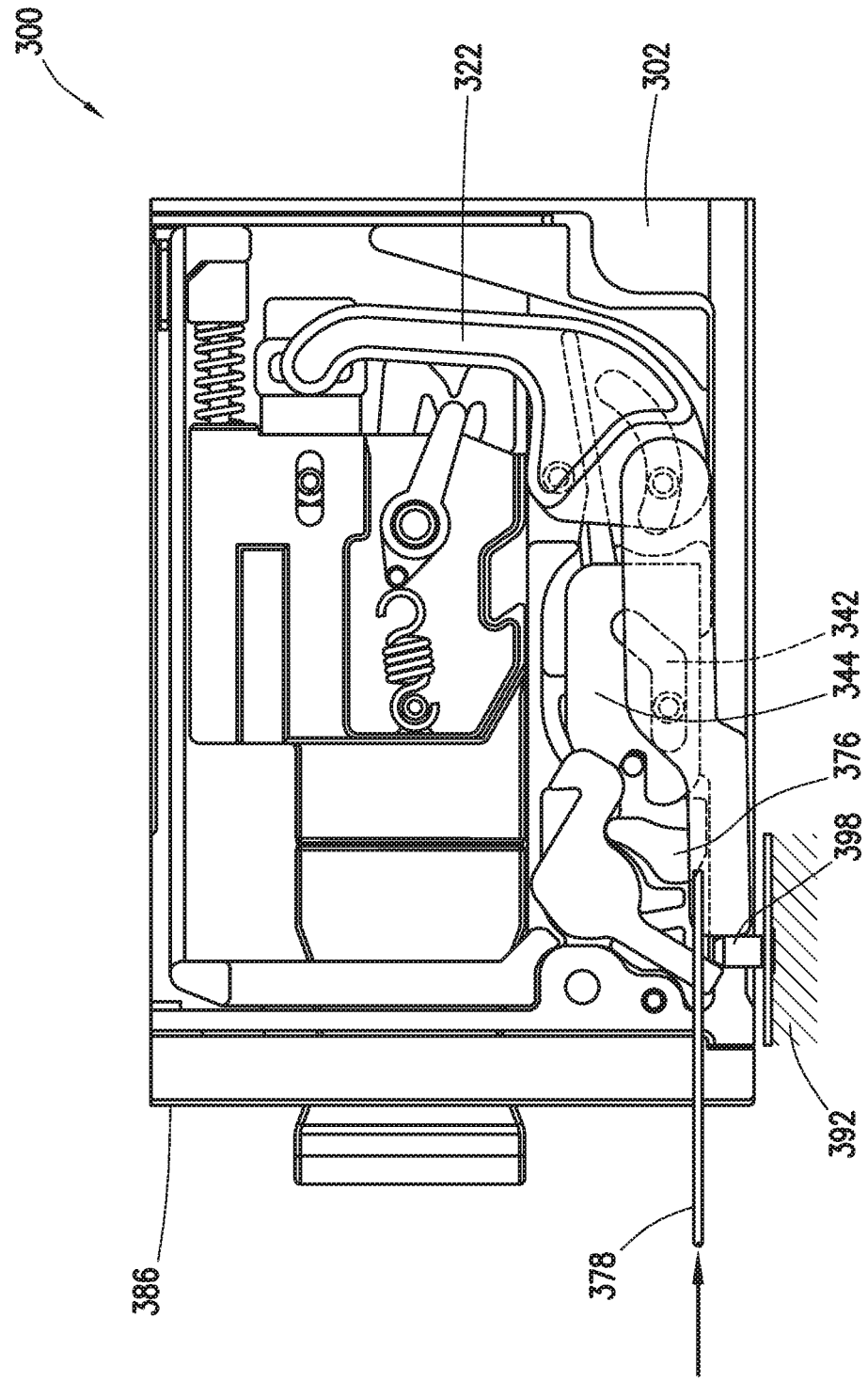
Figure 5B:
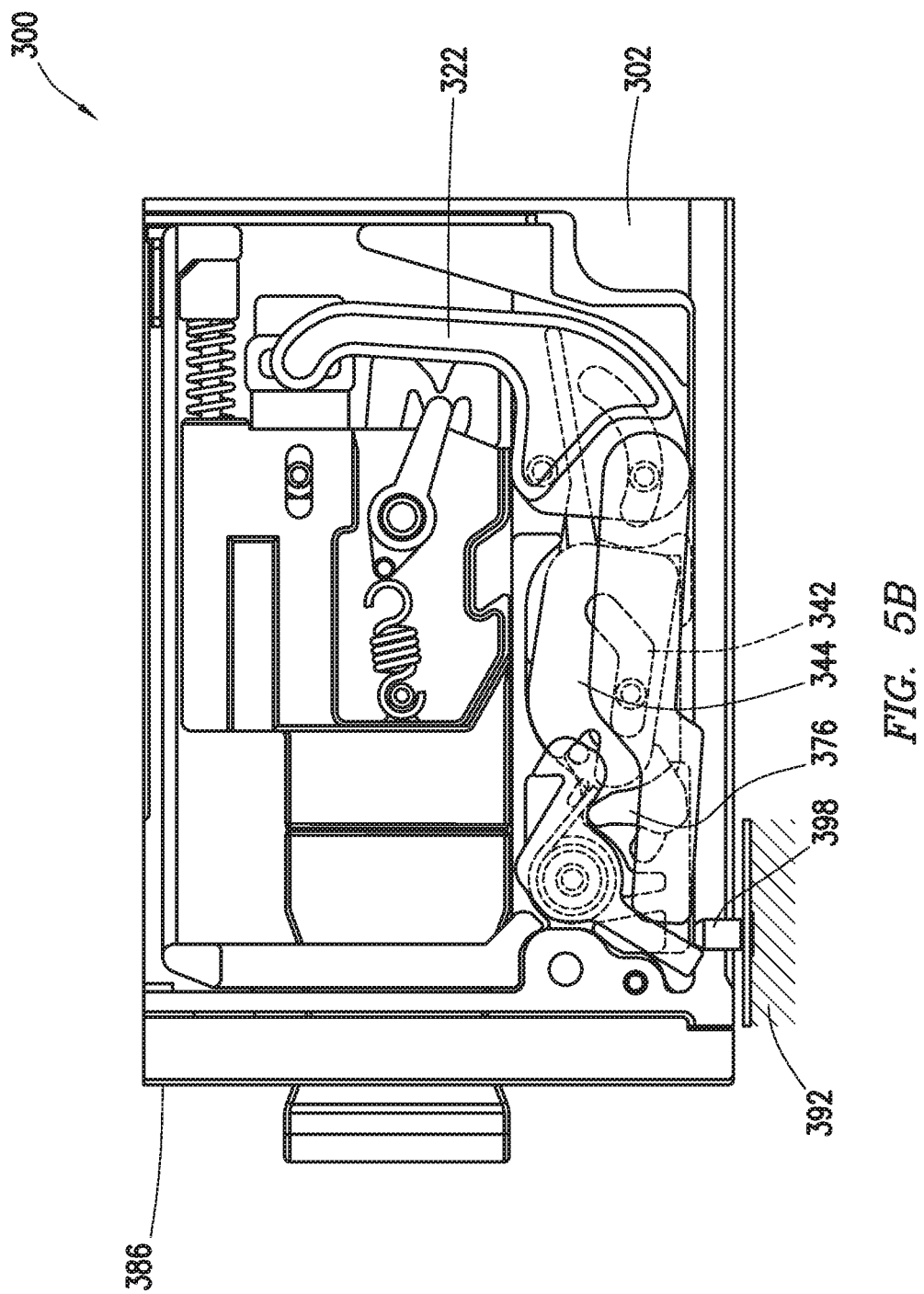

FIGS. 5A and 5B show views of a mechanical latch module (300), in accordance with one or more embodiments of the technology. FIGS. 5A and 5B are intended to illustrate an emergency release function of the latch module (300). The emergency release function may enable the disengaging of the latch module, even in situations where disengaging the latch module, as previously described with reference to FIGS. 4G and 4H, is not feasible, for example, because an element of the latch module is jammed, or for any other reasons that render the latch module nonfunctional.

FIG. 5A shows the mechanical latch module in an engaged state, as previously described with reference to FIGS. 4E and 4F. The latch arm (328) and the inverter arm (322) are shown semi-transparently. Details covered by the latch arm and the inverter arm, such as the track arm slot (342), are therefore visible. In one embodiment of the technology, the track arm slot (342) determines the trajectory of the latch arm (328) between the blocking and the non-blocking positions. The track arm slot (342) therefore also determines the location of the latch arm (328) when the latch module (300) is engaged, i.e., when the latch arm (328) is in the blocking position, as shown in FIG. 5A. The track arm slot (342), in accordance with an embodiment of the technology, is located in the track arm (344). The track arm (344) may be pivotally coupled to the latch module chassis (302). Pivoting the track arm (344) may therefore alter the location of the track arm slot (342), as described below with reference to FIG. 5B. During regular operation of the latch, as illustrated in FIGS. 4A-4H, the track arm (344) may be prevented from pivoting by a spring wire (374) that exerts a downward force on the track arm.

In one embodiment of the technology, an emergency release arm (376), when actuated by a wire tool (378), inserted into the latch module (300) via faceplate (386), may cause pivoting of the latch arm (328), as discussed below, with reference to FIG. 5B. The emergency release arm (376) may be pivotally coupled to the latch module chassis (302), and may be equipped with a protrusion that engages with the track arm (344).

Turning to FIG. 5B, a mechanical latch module, in accordance with an embodiment of the technology, where there emergency release function has been activated, is shown. The wire tool (378) has been inserted into the latch module (300) to cause counterclockwise pivoting of the emergency release arm (376). The pivoting emergency release arm, in turn, has caused clockwise pivoting of the track arm (344) into the position illustrated in FIG. 5B. In this position, the track arm slot (342) may have rotated such that the latch arm (328) no longer interfaces with the retaining pin (398) of the system chassis (392), thus allowing removal of the hardware module from the system chassis.

One skilled in the art will recognize that the technology is not limited to the components shown in FIGS. 1A-5B. For example, the use of the mechanical latch module is not limited to securing solid state storage modules in a storage system chassis. Rather, the latch module may be used in any scenario where mechanically securing one component to another component may be desirable or necessary. Further, the technology is not limited to the exemplary embodiments of latch modules, shown in FIGS. 3A-5B. For example, depending on the intended application of a latch module, a latch module, in accordance with an embodiment of the technology, may include additional parts, or alternatively, parts shown in FIGS. 3A-5B may not be included. In addition, the arrangement and geometry of parts may also deviate from the exemplary embodiments shown in FIGS. 3A-5B. Further, various materials or combinations of materials may be used for the parts of the latch module. These materials may include metals such as aluminum, stainless steel, titanium, etc., polymers, ceramic materials, composite materials, etc. Further, materials may also be surface treated. For example, surfaces may be anodized and/or colored.

Embodiments of the technology may enable the mechanical securing of components, e.g., of a hardware module in a system chassis, using a mechanical latch module, in accordance with one or more embodiments of the technology.

The latch module, in accordance with one or more embodiments of the technology, may provide spring-biased retention of a hardware module into a system chassis, ensuring that the hardware module is fully seated, despite manufacturing variations of the hardware module and/or the system chassis. A latch biasing spring that, when the latch module is engaged, maintains a continuous insertion pressure, in accordance with an embodiment of the technology. This insertion pressure may maintain the hardware module in a fully seated position, ensuring proper electrical connection, and may prevent movement or chattering during shipping or other vibrational conditions that may cause fretting at connectors and may thus erode the contact material and impact signal quality over time.

Further, the mechanical latch module, in accordance with an embodiment of the technology, is operated using push-push operation, i.e., a first push of the button engages the latch module, and a second push of the button disengages the latch module. In the disengaged state, the button may visibly protrude from a faceplate of the latch module or of the hardware module secured by the latch module, thus serving as a visual indicator for the latch module not being engaged. The protruding button may also serve as a pull tab, allowing a user to extract an inserted hardware module from a system chassis, by pulling on the pull tab. In the engaged state of the latch module, the button may remain in a depressed position, thereby minimizing the footprint and preventing inadvertent damage.

In addition, the latch module, in accordance with one or more embodiments of the technology, includes a positional lock-out feature that maintains the button in the "presented", i.e., extended position, until the hardware module has been installed in a system chassis such that the latch module may engage with a retaining pin on the chassis. The lock-out feature may prevent a false latched condition and may provide the user with a visual indication that the module, while inserted, is not mechanically secured.

In one embodiment of the technology, the latch module also includes features that enable the user to override the normal push-push motion of the button to release the latch in the event of malfunction, i.e., an emergency release that can be activated by use of a special tool.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. A latch module, for connecting to a retaining pin of a chassis, comprising:
   a button carriage comprising a user-operable button,
      wherein the button carriage is slidably coupled to a latch module chassis of the latch module, thereby enabling the button carriage to move between an extended and a depressed position with respect to the latch module chassis, and
      wherein the button carriage, when the button is depressed a first time, moves from the extended position to the depressed position;
   an inverter arm,
      wherein the inverter arm is pivotally coupled to the latch module chassis,
      wherein the inverter arm is mechanically linked to the button carriage at a first end of the inverter arm, and
      wherein the button carriage, moving from the extended position to the depressed position, as the button is depressed, causes the inverter arm to pivot;
   a latch arm, mechanically linked to a second end of the inverter arm,
      wherein the latch arm is slidably coupled to the latch module chassis,
      wherein pivoting of the inverter arm causes the latch arm to slide from a non-blocking position into a blocking position,
      wherein, in the blocking position, the latch arm extends toward and makes contact with the retaining pin of the chassis, and
      wherein, in the non-blocking position, the latch arm is away from and not in contact with the retaining pin of the chassis; and
   a latch biasing spring between the button carriage and the inverter arm, generating a biasing force that, in the blocking position, causes the inverter arm to exert a force against the retaining pin.

2. The latch module of claim 1, further comprising:
   a button carriage biasing spring,
      wherein the button carriage biasing spring generates a force opposing the sliding movement of the button carriage as the button carriage moves from the extended position to the depressed position.

3. The latch module of claim 2, further comprising:
   a locking mechanism that fixes the button carriage in the depressed position when the button is depressed for the first time,
      wherein the locking mechanism is configured to lock the button carriage in the depressed position after the button is released after the first time it is depressed.

4. The latch module of claim 3, wherein the locking mechanism is further configured to release the button carriage from the depressed position when the button is depressed and released a second time.

5. The latch module of claim 3, wherein the locking mechanism comprises:
   a self-centering follower arm,
      wherein the follower arm is pivotally linked to the button carriage, and
      wherein the follower arm is configured to move in an engaging segment of a follower arm track circuit from a disengaged position where the follower arm is in a centered state to an engaged position, when the button is depressed for the first time,
      wherein the follower arm is in the disengaged position when the button carriage is in the extended position;
      wherein the follower arm is in the engaged position when the button carriage is in the depressed position; and
      wherein the engaging segment of the follower arm track circuit is shaped to:
         drive the follower arm away from the centered state as the button carriage moves from the extended to the depressed position; and
         hold the follower arm and the mechanically linked button carriage in the depressed position as the user releases the button.

6. The latch module of claim 5, wherein the follower arm is further configured to move in a disengaging segment of the follower arm track circuit, different from the engaging segment, from the engaged position to the disengaged position when the button is pressed and released the second time, wherein the disengaging segment is shaped to:
   enable the follower arm to return to the centered state as the user releases the button and the button carriage returns to the extended position.

7. The latch module of claim 5, wherein the locking mechanism further comprises an extension spring for returning the self-centering follower arm to the centered state.

8. The latch module of claim 5, wherein the follower arm track circuit is a grove in the latch module chassis.

9. The latch module of claim 1, wherein the inverter arm increases the biasing force.

10. The latch module of claim 1, wherein the latch biasing spring is a compression spring.

11. The latch module of claim 1, wherein the latch biasing spring is housed in a cavity of the button carriage,
   wherein a plunger caps the cavity and interfaces with the inverter arm; and
   wherein the plunger is configured to slidably move into the cavity as the latch arm reaches the blocking position, thereby compressing the latch biasing spring.

12. A latch module, for connecting to a retaining pin of a chassis, comprising:
   a button carriage comprising a user-operable button,
      wherein the button carriage is slidably coupled to a latch module chassis of the latch module, thereby enabling the button carriage to move between an extended and a depressed position with respect to the latch module chassis, and wherein the button carriage, when the button is depressed a first time, moves from the extended position to the depressed position;

an inverter arm,
    wherein the inverter arm is pivotally coupled to the latch module chassis,
    wherein the inverter arm is mechanically linked to the button carriage at a first end of the inverter arm, and
    wherein the button carriage, moving from the extended position to the depressed position, as the button is depressed, causes the inverter arm to pivot;

a latch arm, mechanically linked to a second end of the inverter arm,
    wherein the latch arm is slidably coupled to the latch module chassis,
    wherein pivoting of the inverter arm causes the latch arm to slide from a non-blocking position into a blocking position,
    wherein, in the blocking position, the latch arm extends toward and makes contact with the retaining pin of the chassis, and
    wherein, in the non-blocking position, the latch arm is away from and not in contact with the retaining pin of the chassis; and a lock arm, pivotally coupled to the latch module chassis,
    wherein the lock arm is configured to engage with the button carriage, thereby preventing the button carriage from leaving the extended position, when the lock arm is not actuated by the retaining pin.

13. The latch module of claim 12, wherein the lock arm is further configured to disengage from the button carriage, thereby enabling the button carriage to move to leave the extended position, when the lock arm is actuated by the retaining pin.

14. A latch module, for connecting to a retaining pin of a chassis, comprising:

a button carriage comprising a user-operable button,
    wherein the button carriage is slidably coupled to a latch module chassis of the latch module, thereby enabling the button carriage to move between an extended and a depressed position with respect to the latch module chassis, and
    wherein the button carriage, when the button is depressed a first time, moves from the extended position to the depressed position;

an inverter arm,
    wherein the inverter arm is pivotally coupled to the latch module chassis,
    wherein the inverter arm is mechanically linked to the button carriage at a first end of the inverter arm, and
    wherein the button carriage, moving from the extended position to the depressed position, as the button is depressed, causes the inverter arm to pivot;

a latch arm, mechanically linked to a second end of the inverter arm,
    wherein the latch arm is slidably coupled to the latch module chassis,
    wherein pivoting of the inverter arm causes the latch arm to slide from a non-blocking position into a blocking position,
    wherein, in the blocking position, the latch arm extends toward and makes contact with the retaining pin of the chassis, and
    wherein, in the non-blocking position, the latch arm is away from and not in contact with the retaining pin of the chassis; and a track arm, pivotally coupled to the latch chassis,
    wherein the track arm comprises a track that defines a trajectory of the latch arm between the non-blocking and blocking positions of the latch arm, when the track arm is in an operating position.

15. The latch module of claim 14,
wherein the track arm is configured to pivot into an emergency release position,
wherein, in the emergency release position, the latch arm is retracted from the blocking position, thereby enabling the latch arm to clear the retaining pin of the chassis.

16. The latch module of claim 15, further comprising:
an emergency release arm that pivots the track arm into the emergency release position.

17. The latch module of claim 1, wherein the user-operable button, when the button carriage is in the extended position, provides a visual indicator for the latch arm being in the non-blocking position.

18. A system comprising:
a hardware module equipped with the latch module of claim 1,
    wherein the latch module mechanically secures the hardware module in the chassis.

19. The system of claim 18, wherein the user-operable button forms a pull tab configured to enable a user to extract the hardware module from the chassis by pulling on the pull tab.

* * * * *